(12) United States Patent
Savage

(10) Patent No.: US 6,664,812 B2
(45) Date of Patent: Dec. 16, 2003

(54) SLEW BASED CLOCK MULTIPLIER

(75) Inventor: Scott Savage, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/116,894

(22) Filed: Apr. 5, 2002

(65) Prior Publication Data

US 2003/0189444 A1 Oct. 9, 2003

(51) Int. Cl.[7] ............................................. H03K 11/26
(52) U.S. Cl. ................................... 326/93; 327/116
(58) Field of Search ................................. 327/116, 276, 327/119; 326/93–98

(56) References Cited

U.S. PATENT DOCUMENTS 5,818,270 A * 10/1998 Hamza ..................... 327/116
6,121,811 A * 9/2000 Scott et al. ................ 327/276
6,201,424 B1 * 3/2001 Harrison .................... 327/159

* cited by examiner

Primary Examiner—Don Le
(74) Attorney, Agent, or Firm—Trexler, Bushnell, Giangiorgi & Blackstone, Ltd.

(57) ABSTRACT

A slew based clock multiplier which outputs a fraction of a master clock without having to use, as a reference, an edge of a higher frequency clock, and without having to use precision delay cells to delay edges of the master clock. The slew based clock multiplier can be configured to provide such an output as the result of a ratio of input current sources, a ratio of capacitors in the circuit, or as a result of a combination of the two.

15 Claims, 4 Drawing Sheets

SLEW BASED CLOCK MULTIPLIER

BACKGROUND

This invention generally relates to clocking circuitry and methods of creating timing references on chip. The invention more specifically relates to a slew based clock multiplier which is configured to create any fraction of a master clock relatively precisely. The invention also specifically relates to a method of using such a slew based clock multiplier to create a fraction of a master clock.

Generally, to create a timing reference within a percentage of a single clock cycle, a high frequency clock is used. The clock signal is divided down to a lower frequency, and an edge of a higher frequency clock is used as a reference. However, if one is trying to create a timing reference within the clock period of the maximum on chip clock, an edge of a higher frequency clock does not exist.

Another method of creating a timing reference is to use precision delay cells (i.e., buffers configured to provide a large delay) to delay off the edges of the maximum clock. However, precision delay cells are usually not precise. They have 2:1 variations in delay times, which causes highly variant timing references.

OBJECTS AND SUMMARY

A general object of an embodiment of the present invention is to provide a slew based clock multiplier and a method of using a slew based clock multiplier.

Another object of an embodiment of the present invention is to provide a slew based clock multiplier which is configured to create any fraction of a master clock relatively precisely.

Still another object of an embodiment of the present invention is to provide a slew based clock multiplier which is configured to create a timing reference within a percentage of a single clock cycle without using an edge of a higher frequency clock as a reference.

Another object of an embodiment of the present invention is to provide a method of creating a timing reference within a percentage of a single clock cycle without using an edge of a higher frequency clock as a reference.

Still yet another object of an embodiment of the present invention is to provide a method of creating a timing reference within a percentage of a single clock cycle without using precision delay cells.

Briefly, and in accordance with at least one of the forgoing objects, an embodiment of the present invention provides a slew based clock multiplier which outputs a fraction of a master clock without having to use, as a reference, an edge of a higher frequency clock, and without having to use precision delay cells to delay edges of the master clock. The slew based clock multiplier can be configured to provide such an output as the result of a ratio of input current sources, as the result of a ratio of capacitors in the circuit, or as a result of a combination of the two.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which.

DESCRIPTION

Figure 1:
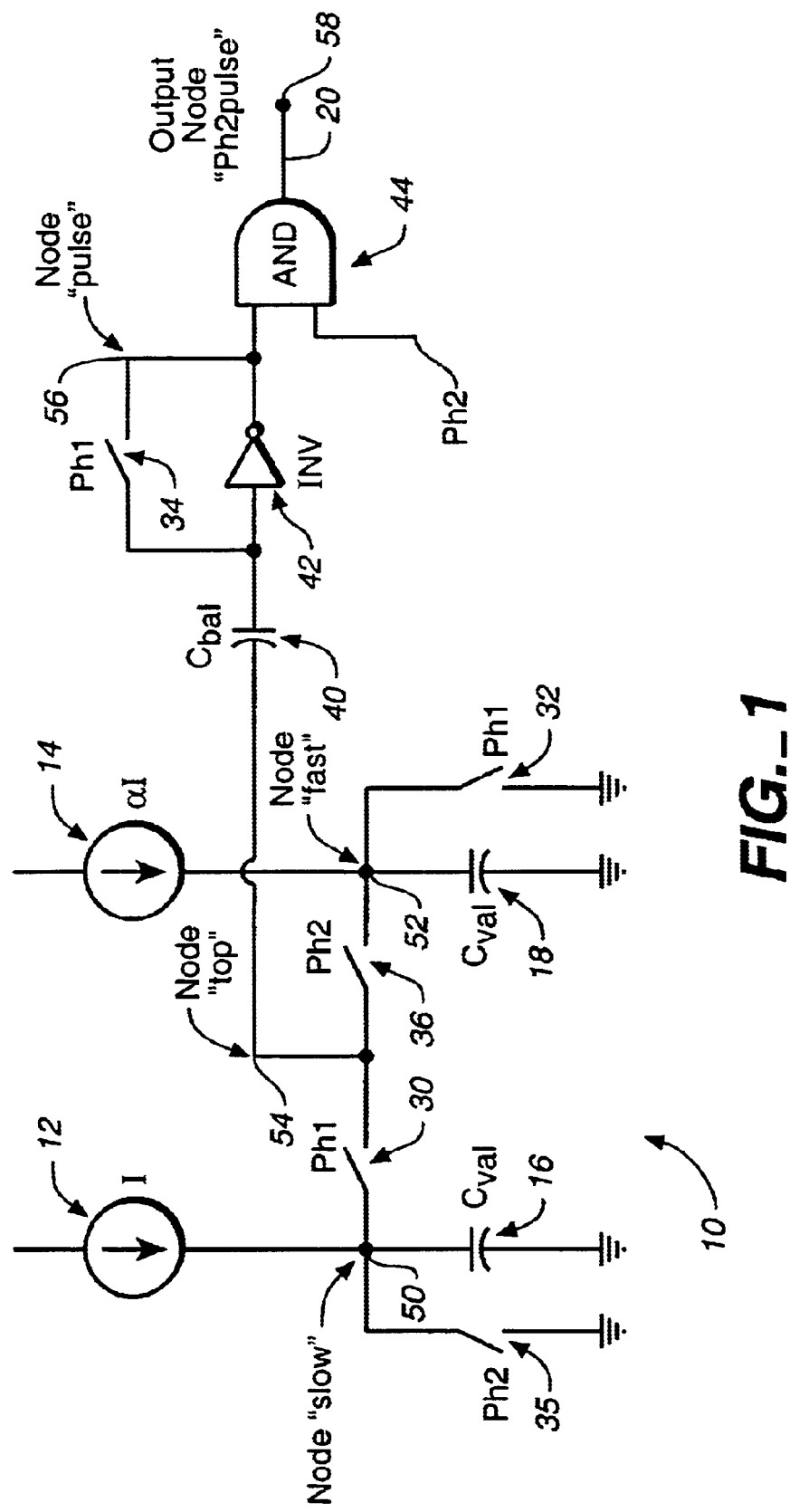
FIG. 1 is a schematic representation of a slew based clock multiplier which is in accordance with an embodiment of the present invention.

While the invention may be susceptible to embodiment in different forms, there is shown in the drawings, and herein will be described in detail, specific embodiments with the understanding that the present disclosure is to be considered an exemplification of the principles of the invention, and is not intended to limit the invention to that as illustrated and described herein.

FIG. 1 illustrates a slew based clock multiplier 10 which is in accordance with an embodiment of the present invention. The slew based clock multiplier 10 is configured to create timing reference within a percentage of a single clock cycle. The slew based clock multiplier 10 is configured to output a fraction of a master clock without having to use, as a reference, an edge of a higher frequency clock, and without having to use precision delay cells to delay edges of the master clock. The slew based clock multiplier 10 can be configured to provide such an output as the result of a ratio of input current sources 12, 14, as the result of a ratio of capacitors 16, 18 in the circuit, or as a result of a combination of these two things.

The slew based clock multiplier 10 can be used to create any fraction of the master clock relatively precisely, and the slew based clock multiplier 10 is process, temperature, and bias current insensitive. Unlike a precision delay cell, the output 20 of the slew based clock multiplier 10 does not change with variations in transistor transconductance, die temperature, or absolute value of the current sources. The main sensitivity of the slew based clock multiplier 10 is random device mismatch, and this source of error is relatively minor compared to sources of error which have come to be associated with the prior art.

As shown in FIG. 1, two current sources 12 and 14 are supplied to the slew based clock multiplier 10—a first current source 12 having a value I and a second current source 14 having a value $\alpha$ (alpha) * I (wherein $\alpha$ (alpha) is a number greater than 1). In addition, the slew based clock multiplier 10 includes a plurality of switches 30, 32, 34, 35, 36—a set of switches 30, 32, 34 which are configured to be closed when a first clock, ph1, is high (i.e., ph1 =1) (see FIG. 3) and configured to be opened when the first clock is low (i.e., ph1=0) (see FIG. 4); and switches 35, 36 which are configured to be closed when a second clock, ph2, is high (i.e., ph2=1) (see FIG. 4) and are configured to be opened when the second clock is low (i.e., ph2=0) (see FIG. 3).

The slew based clock multiplier 10 also includes two capacitors 16, 18 (marked "Cval" in FIGS. 1, 3 and 4) of equal value, and a third capacitor 40 (marked "Cbal" in FIGS. 1, 3 and 4) which preferably has a value which is much less than that of capacitors 16 and 1 8. The slew based clock multiplier 10 also includes an inverter 42 (marked "INV" in FIGS. 1, 3 and 4) which is preferably a two-transistor CMOS inverter, and combinational logic 44 which is preferably a six transistor CMOS AND gate. Various nodes 50, 52, 54, 56, 58 are labeled for description in FIG. 1, namely slow, fast, top, pulse, and ph2pulse, respectively.

Figure 2:
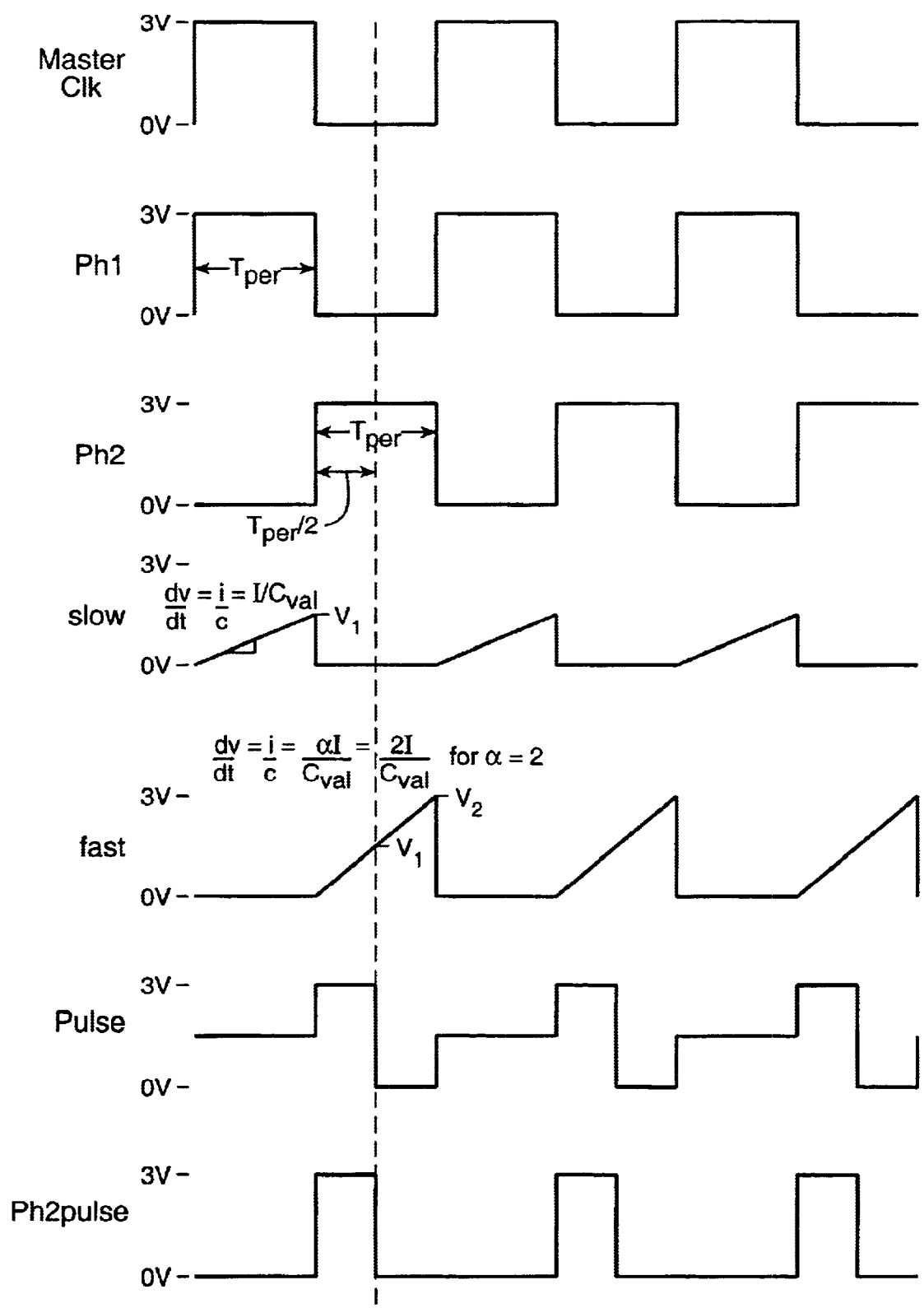
FIG. 2 illustrates a plurality of timing waveforms and voltage waveforms which relate to operation of the slew based clock multiplier illustrated in FIG. 1.

FIG. 2 contains relevant timing waveforms and voltage waveforms relating to the operation of the slew based clock multiplier 10 shown in FIG. 1. The waveforms shown in FIG. 2 give relative timings between clocks and voltage waveforms. "Master clk" is the maximum frequency on chip clock generally of a 50/50 duty cycle. Ph1 and Ph2 clocks are common, non-overlapping clocks (meaning not simultaneously high) directly derived from Master clk and applied to switches 30, 32, 34, 35 and 36. "Slow" and "fast" are the voltage waveforms at the nodes labeled "slow" (50 in FIGS. 1, 3 and 4) and "fast" (52 in FIGS. 1, 3 and 4) for the case of (alpha=2). "Pulse" (56 in FIGS. 1, 3 and 4) is an intermediate output explained in more detail hereinbelow, and "Ph2pulse" is the main output 20 of the slew based clock multiplier 10. V1 is the maximum voltage value of the node "slow" (50 in FIGS. 1, 3 and 4) at the end of the Ph1=high interval, while V2 is the maximum voltage value of node "fast" (52 in FIGS. 1, 3 and 4) at the end of the Ph2=high interval. Tper is the pulse width of either Ph1 or Ph2 while high. For illustration purposes, FIG. 2 digital signals (Master Clk, Ph1, Ph2, Ph2pulse) are 0 (low) to 3 v (high) signals. And finally, analog signals (slow, fast, pulse) are between 0 and 3 v, as shown in FIG. 2.

Figure 3:
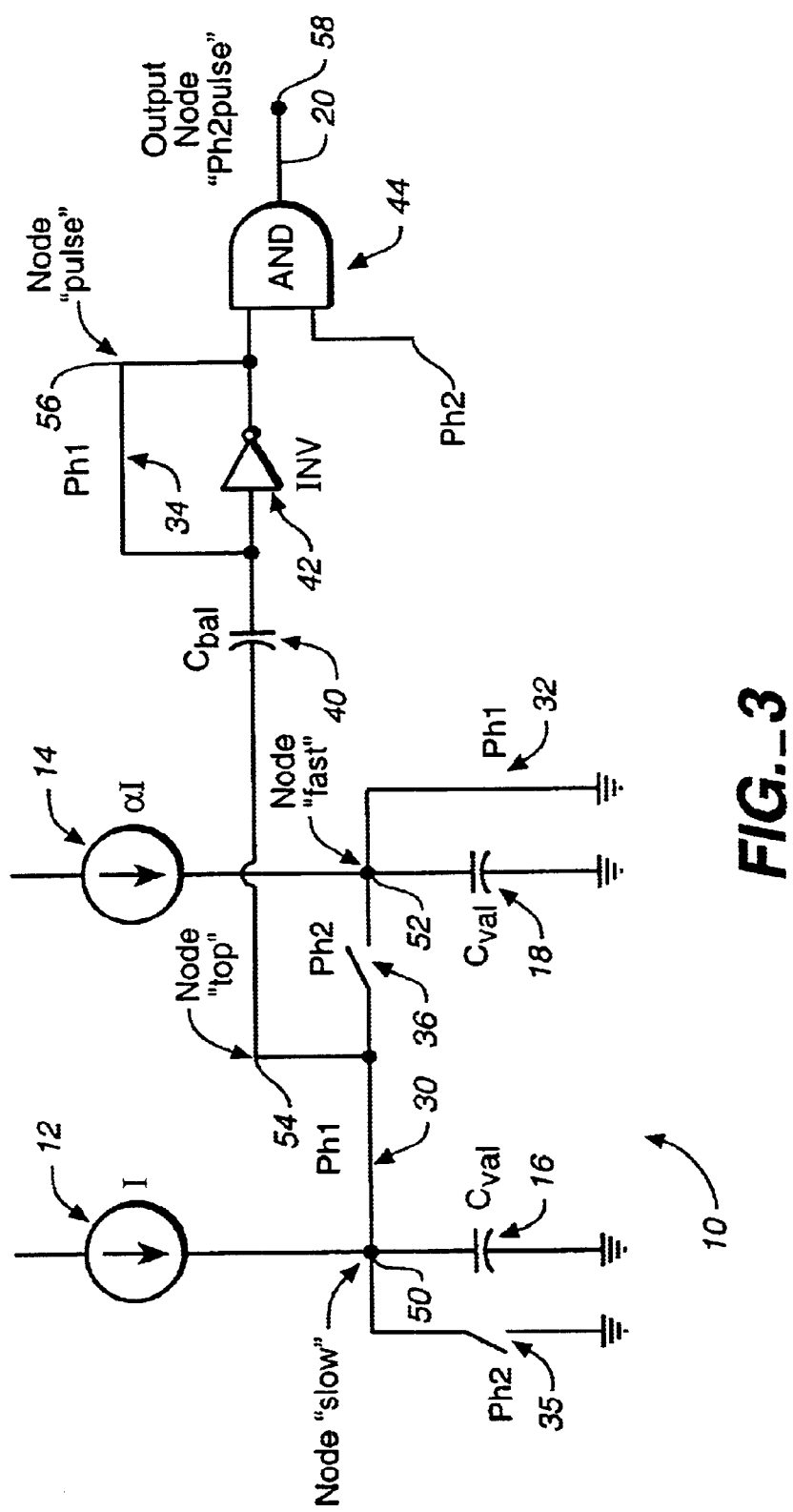
FIG. 3 is a schematic representation of the slew based clock multiplier shown in FIG. 1, showing a first set of switches closed and a second set of switches open.

Operation of the slew based clock multiplier 10 shown in FIG. 1 will now be described with reference to FIGS. 2–4. After Ph1 has just transitioned from low to high and switches 30, 32, 34 have closed as shown in FIG. 3, the node "slow" (50) begins to slew at the rate of dv/dt=I/Cval as shown in FIG. 2. The input and output of inverter 42 are centered at the inverter's trip point from the shorting switch between its input and output (generally the trip point is near ½ of the supply span). Capacitor 40 (Cbal) stores the potential difference between slow (50) and the inverter's trip point as slow (50) ramps from 0 v to V1 (V1=Tper*I)/Cval). When Ph1 transitions from high to low, capacitor 40 (Cbal) stores the voltage at which the inverter 42 is about to trip when the node "top" (54) is at the value V1.

Figure 4:
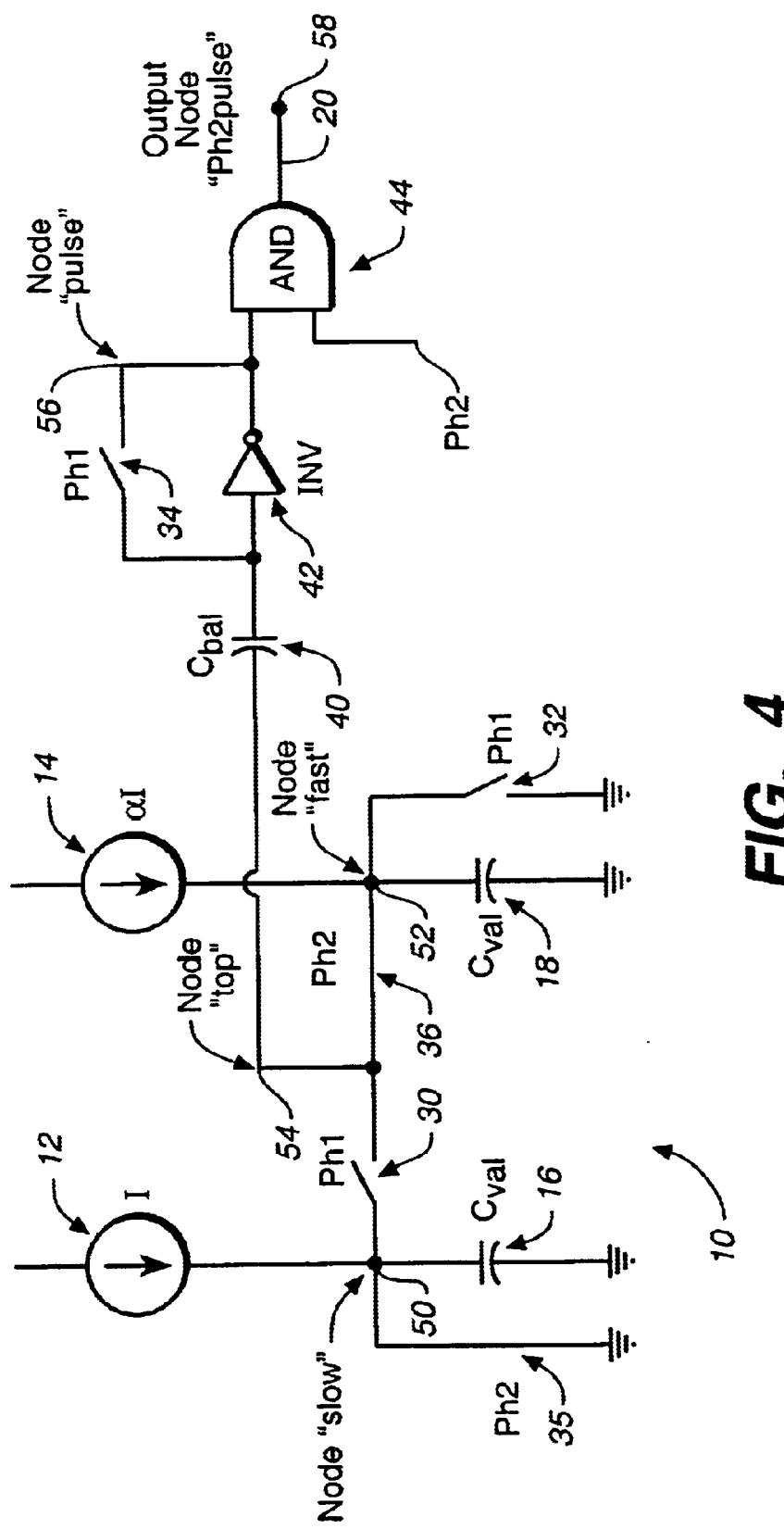
FIG. 4 is a view similar to FIG. 3, but showing the first set of switches open and the second set of switches closed.

After Ph2 has just transitioned from low to high and switches 35 and 36 have closed as shown in FIG. 4, the node "fast" (52) begins to slew at a rate of dv/dt=2I/Cval, as shown in FIG. 2. In FIG. 2, alpha is assigned the value of 2 for purposes of explanation. With alpha at a value of 2, "fast" (52) charges up twice as quickly as node "slow" (50) hence "fast" (52) has a value of V1 at Tper/2 seconds into Ph2. The node "top" (54) is connected to node "fast" (52) via switch 36. As node "fast" (52) ramps from 0 v to V2, the inverter 42 passes through its trip point when node "fast" (52) achieves a voltage of value V1 at Tper/2. When node "top" (54) achieves a value of V1 from the ramping of node "fast" (52), the output of inverter 42 transitions from a high to low value as shown in FIG. 2 ("pulse").

The logical AND combination of "pulse" and "Ph2" at logic 44 produces output "Ph2pulse." Since alpha was chosen to be 2, Ph2pulse is (1/alpha)*Tper or Tper/2 seconds wide. Ph2pulse can be chosen to be any fraction of Tper by altering alpha (i.e., the ratio of the value of the current sources 12 and 14).

The slew based clock multiplier 10 is easily programable. One could adjust the current source ratio, alpha, in order to vary Ph2pulse "on the fly". Alternatively, capacitors 16 and 18 (Cval) can be provided as having unequal values in which case the ratio of one capacitor to the other will define the ratio of the output of the slew based clock multiplier 10 to the master clock. Still further, unequal current sources 12 and 14 can be applied and unequal capacitors 16 and 18 (Cval) can be used in the slew based clock multiplier 10 in which case a ratio of the output of the slew based clock multiplier 10 to the master clock will depend on a ratio of the one current source 14 compared to the other 12 and a ratio of the one capacitor 18 compared to the other 16.

Alternative methods of use are limitless in terms of creating timing references for different circuits. The slew based clock multiplier 10 can be used to time activities in an Analog to Digital converter, but this is just one of many possibilities. The slew based clock multiplier 10 can be embodied in a general-purpose hardmac, and may be provided as a portion of a 10-bit pipeline Analog-to-Digital Converter. Of course, other embodiments are possible.

The slew based clock multiplier 10 has the ability to create any fraction of the master clock relatively precisely. This circuit is process, temperature, and bias current insensitive. Unlike a precision delay cell, the output of the slew based clock multiplier 10 will not change with variations in transistor transconductance, die temperature, or absolute value of the current sources. The main sensitivity of the slew based clock multiplier 10 is random device mismatch, and this source of error is relatively minor compared to sources of error which have come to be associated with the prior art.

While an embodiment of the present invention is shown and described, it is envisioned that those skilled in the art may devise various modifications of the present invention without departing from the spirit and scope of the appended claims.

What is claimed is:

1. A method of using a slew based clock multiplier to provide an output which is a fraction of a master clock, said method comprising: providing a first current source to the slew based clock multiplier; providing a second current source to the slew based clock multiplier, wherein said first current source and said second current source are unequal; and having said slew based clock multiplier use the first and second current sources to provide the output, wherein a ratio of the output of the slew based clock multiplier to the master clock depends on a ratio of said second current source to said first current source and a ratio of a first capacitor to a second capacitor in the slew based clock multiplier.

2. A slew based clock multipler comprising a circuit which is configured to output a fraction of a master clock without having to use as a reference an edge of a clock having a higher frequency than a frequency of the master clock, and without having to use precision delay cells to delay edges of the master clock, wherein said circuit is configured to receive a first current source and a second current source said circuit configured such that a ratio of the output of the slew based clock multiplier to the master clock is the same as a ratio of said second current source to said first current source.

3. A slew based clock multiplier as claimed in claim 2, said circuit further comprising a first capacitor and a second capacitor, said circuit configured such that a ratio of the output of the slew based clock multiplier to the master clock is the same as a ratio of said first capacitor to said second capacitor.

4. A slew based clock multiplier comprising a circuit which is configured to output a fraction of a master clock without having to use as a reference an edge of a clock having a higher frequency than a frequency of the master clock, and without having to use precision delay cells to delay edges of the master clock, wherein said circuit is configured to receive a first current source and a second current source, said circuit further comprising a first capacitor and a second capacitor, said circuit configured such that a ratio of the output of the slew based clock multiplier to the master clock depends on a ratio of said second current source to said first current source and a ratio of said first capacitor to said second capacitor.

5. A slew based clock multiplier which is configured to receive a first clock and a second clock, wherein the first and second clocks are derived from a master clock, said slew based clock multiplier configured to output a fraction of the master clock, said slew based clock multiplier comprising: at least one switch which is configured to close when the first clock is high and is configured to open when the first clock is low; at least one switch which is configured to close when the second clock is high and is configured to open when the second clock is low, said slew based clock multiplier including a first node, a second node, an inverter and a capacitor, said inverter including an input, an output and a trip point, said slew based clock multiplier configured to provide that when said first clock transitions from low to high, a voltage at the first node increases, the input and output of the inverter center at the trip point of the inverter, and the capacitor stores a potential difference between the voltage at the first node and the trip point of the inverter, said slew based clock multiplier configured to provide that when said first clock transitions from high to low, the capacitor stores a voltage at which said inverter is about to trip, said slew based clock multiplier configured to provide that when said second clock transitions from low to high, a voltage at the second node increases and the inverter passes through the trip point of the inverter when the voltage at the second node reaches a predetermined level, and the output of the inverter transitions from high to low, said slew based clock multiplier configured to combine the output of the inverter and the second clock to provide the output of said slew based clock multiplier, said output of said slew based clock multiplier being a fraction of the master clock.

6. A slew based clock multiplier as claimed in claim 5, wherein said slew based clock multiplier is configured to receive a first current source and a second current source, said slew based clock multiplier configured such that a ratio of the output of the slew based clock multiplier to the master clock is the same as a ratio of said second current source to said first current source.

7. A slew based clock multiplier as claimed in claim 5, further comprising a first capacitor and a second capacitor, said slew based clock multiplier configured such that a ratio of the output of the slow based clock multiplier to the master clock is the same as a ratio of said first capacitor to said second capacitor.

8. A slow based clock, multiplier as claimed in claim 5, wherein said slew based clock multiplier is configured to receive a first current source and a second current source, said slow based clock multiplier further comprising a first capacitor and a second capacitor, said slew based clock multiplier configured such that a ratio of the output of the slew based clock multiplier to the master clock depends on a ratio of said second current source to said first current source and a ratio of said first capacitor to said second capacitor.

9. A slew based clock multiplier as claimed in claim 5, wherein said slew based clock multiplier is con figured such that the voltage at the second node increases at a higher rate than the voltage at the first node, said slew based clock multiplier configured such that a ratio of the output or the slew based clock multiplier to the master clock is the same as a ratio of a rate of voltage increase at the second node to a rate or voltage increase at the first node.

10. A method of using a slew based clock multiplier to provide an output which is a fraction of a master clock, said method comprising: providing a first current source to the slew based clock multiplier; providing a second current source to the slew based clock multiplier, wherein said first current source and said second current source are unequal; and having said slow based clock multiplier use the first and second current sources to provide the output, wherein a ratio of the output of the slew based clock multiplier to the master clock is the same as a ratio of said second current source to said first current source.

11. A method of using a slew based clock multiplier to provide an output which is a fraction of a master clock, said method comprising: providing said slew based clock multiplier, said slew based clock multiplier including at least one switch which is configured to close when the first clock is high and is configured to open when the first clock is low, at least one switch which is configured to close when the second clock is high and is configured to open when the second clock is low, said slew based clock multiplier also including a first node, a second node, an inverter and a capacitor, said inverter including an input, an output and a trip point, said slew based clock multiplier configured to provide that when said first clock transitions from low to high, a voltage at the first node increases, the input and output of the inverter center at the trip point of the inverter, and the capacitor stores a potential difference between the voltage at the first node and the trip point of the inverter, said slew based clock multiplier configured to provide that when said first clock transitions from high to low, the capacitor stores a voltage at which said inverter is about to trip, said stew based clock multiplier configured to provide that when said second clock transitions from low to high, a voltage at the second node increases and the inverter passes through the trip point of the inverter when the voltage at the second node reaches a pre determined level, and the output of the inverter transitions from high to low, said slew based clock multiplier configured to combine the output of the inverter and the second clock to provide the output of said slow based clock multiplier, said output of said slew based clock multiplier being a fraction of the master clock; and providing said first and second clocks to said slew based clock multiplier, thereby causing the slew based clock multiplier to provide the output.

12. A method as claimed in claim 11, further comprising providing said slew based clock multiplier such that said slew based clock multiplier is configured to receive a first current source and a second current source, said slew based clock multiplier further comprising a first capacitor and a second capacitor, said slew based clock multiplier configured such that a ratio of the output of the slew based clock multiplier to the master clock depends on a ratio of said second current source to said first current source and a ratio of said first capacitor to said second capacitor.

13. A method as claimed in claim 11, further comprising providing said slew based clock multiplier such that said slew based clock multiplier is configured such that the voltage at the second node increases at a higher rate than the voltage at the first node, said slew based clock multiplier configured such that a ratio of the output of the slew based clock multiplier to the master clock is the same as a ratio of a rate of voltage increase at the second node to a rate of voltage increase at the first node.

14. A method as claimed in claim 11 further comprising providing said slew based clock multiplier such that said slew based clock multiplier is configured to receive a first current source and a second current source, said slew based clock multiplier configured such that a ratio of the output of the slew based clock multiplier to the master clock is the same as a ratio of said second current source to said first current source.

15. A method as claimed in claim 11, further comprising providing said slew based clock multiplier such that said slew based clock multiplier includes a first capacitor and a second capacitor, said slew based clock multiplier configured such that a ratio of the output of the slew based clock multiplier to the master clock is the same as a ratio of said first capacitor to said second capacitor.

* * * * *